(12) United States Patent
Reznicek et al.

(10) Patent No.: US 10,636,804 B1
(45) Date of Patent: Apr. 28, 2020

(54) STACKED FINFET PROGRAMMABLE INVERTER (EPROM)

(71) Applicant: International Business Machines Corporation, Armonk, NY (US)

(72) Inventors: Alexander Reznicek, Troy, NY (US); Karthik Balakrishnan, Scarsdale, NY (US); Tak Ning, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/192,140

(22) Filed: Nov. 15, 2018

(51) Int. Cl.
| | |
|---|---|
| *H01L 27/11551* | (2017.01) |
| *H01L 27/11521* | (2017.01) |
| *H01L 21/8238* | (2006.01) |
| *H01L 27/12* | (2006.01) |
| *H01L 27/11517* | (2017.01) |
| *H01L 27/11568* | (2017.01) |
| *H01L 27/092* | (2006.01) |
| *H01L 27/112* | (2006.01) |
| *H01L 21/84* | (2006.01) |
| *H01L 27/088* | (2006.01) |

(Continued)

(52) U.S. Cl.
CPC ........ *H01L 27/11551* (2013.01); *G11C 16/02* (2013.01); *H01L 21/823821* (2013.01); *H01L 21/845* (2013.01); *H01L 27/0886* (2013.01); *H01L 27/0922* (2013.01); *H01L 27/0924* (2013.01); *H01L 27/11226* (2013.01); *H01L 27/11517* (2013.01); *H01L 27/11521* (2013.01); *H01L 27/11568* (2013.01); *H01L 27/1211* (2013.01); *H01L 29/42324* (2013.01); *H01L 29/788* (2013.01); *H01L 29/7855* (2013.01); *H01L 29/785* (2013.01)

(58) Field of Classification Search
CPC ........ H01L 27/11517; H01L 27/11551; H01L 27/0922; H01L 27/0924; H01L 27/7855; H01L 27/72324; H01L 27/788; H01L 27/0886; H01L 29/785; H01L 29/788; H01L 29/42324; H01L 29/7855; H01L 21/823821; H01L 21/845; G11C 16/02
See application file for complete search history.

(56) References Cited

U.S. PATENT DOCUMENTS

| | | |
|---|---|---|
| 6,413,802 B1 | 7/2002 | Hu et al. |
| 6,657,252 B2 | 12/2003 | Fried et al. |

(Continued)

*Primary Examiner* — Joseph C. Nicely
(74) *Attorney, Agent, or Firm* — Scully, Scott, Murphy & Presser, P.C.; L. Jeffrey Kelly, Esq.

(57) ABSTRACT

A stacked FinFET programmable inverter is provided that includes a pFET gate structure including a floating gate and a thicker gate dielectric material layer than a gate dielectric material layer of an nFET gate structure stacked either above, or below, the nFET gate structure. In one embodiment, the pFET gate structure is below the nFET gate structure. In another embodiment, the pFET gate structure is above the nFET gate structure. The pFET gate structure contacts a sidewall of one semiconductor fin portion of a fin stack, while the nFET gate structure contacts a sidewall of another of the semiconductor fin portion of the same fin stack; the two semiconductor fin portions are separated by an insulator fin portion.

20 Claims, 9 Drawing Sheets

(51) Int. Cl.
*H01L 29/78* (2006.01)
*H01L 29/423* (2006.01)
*H01L 29/788* (2006.01)
*G11C 16/02* (2006.01)

(56) References Cited

U.S. PATENT DOCUMENTS

| | | |
|---|---|---|
| 6,914,277 B1 | 7/2005 | Hill et al. |
| 7,064,022 B1 | 6/2006 | Hill et al. |
| 7,700,993 B2 | 4/2010 | Cai et al. |
| 7,994,583 B2 | 8/2011 | Inaba |
| 8,492,228 B1 | 7/2013 | Leobandung et al. |
| 8,705,280 B2 | 4/2014 | Cai et al. |
| 9,536,882 B2 | 1/2017 | Anderson et al. |
| 9,627,270 B2 * | 4/2017 | Cheng ................. H01L 27/0924 |
| 9,659,963 B2 * | 5/2017 | Cheng ................. H01L 27/1211 |
| 10,084,090 B2 | 9/2018 | Cheng et al. |
| 10,304,844 B1 * | 5/2019 | Balakrishnan ..... G11C 16/0466 |
| 2016/0211264 A1 * | 7/2016 | Peng ................... H01L 21/8221 |
| 2017/0133507 A1 * | 5/2017 | Cheng ................. H01L 29/7849 |
| 2018/0269329 A1 * | 9/2018 | Balakrishnan ...... H01L 29/7889 |
| 2019/0172822 A1 * | 6/2019 | Asra ................... H01L 27/0207 |
| 2019/0319021 A1 * | 10/2019 | Xu ..................... H01L 21/76251 |

* cited by examiner

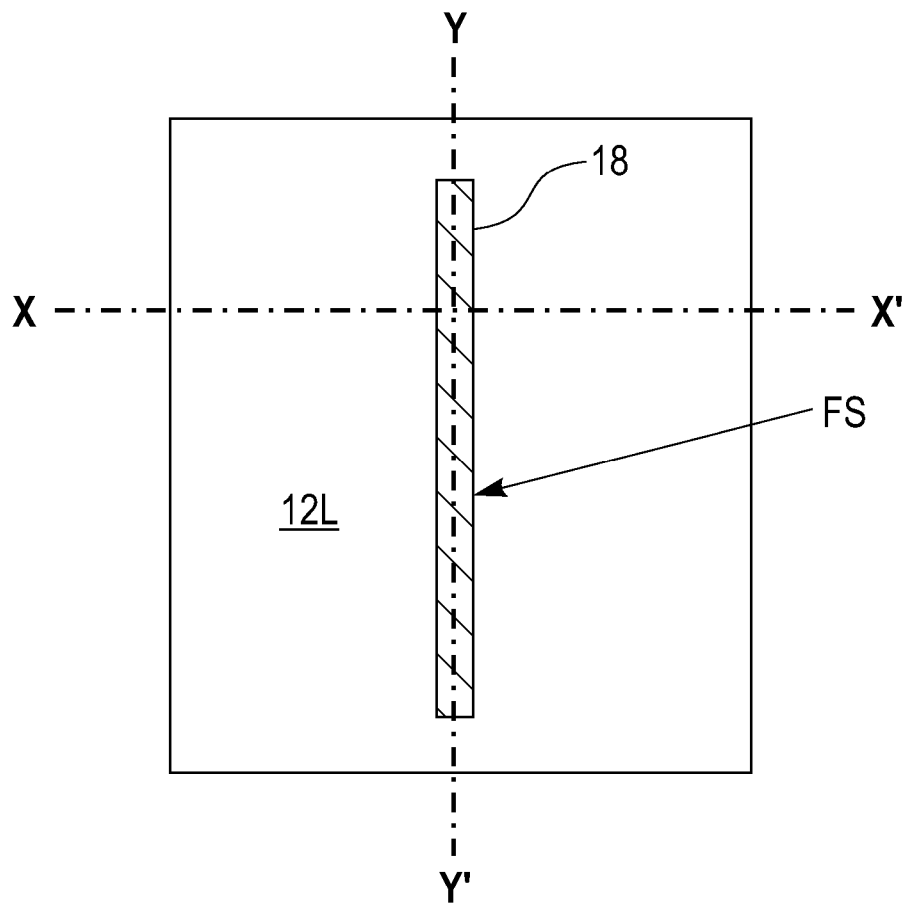
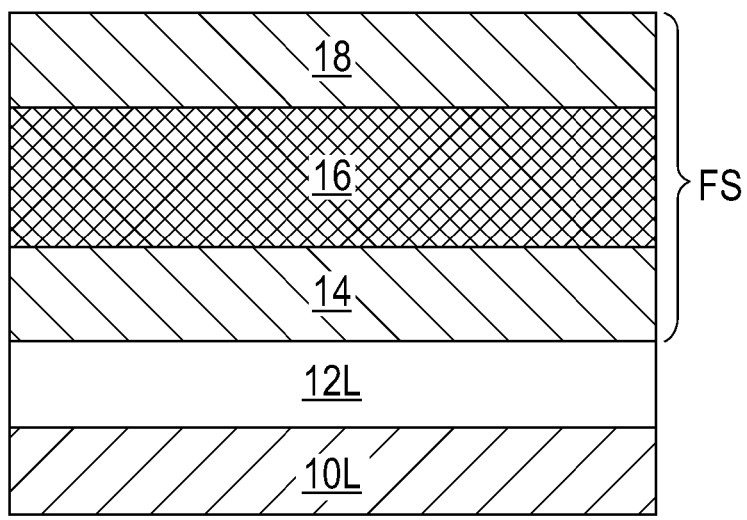 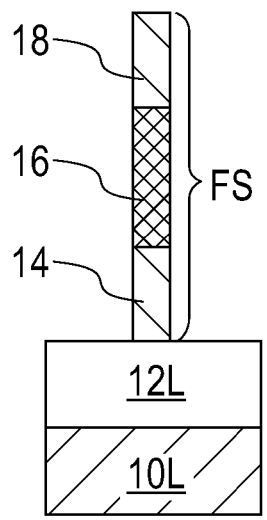
FIG. 1B    FIG. 1C

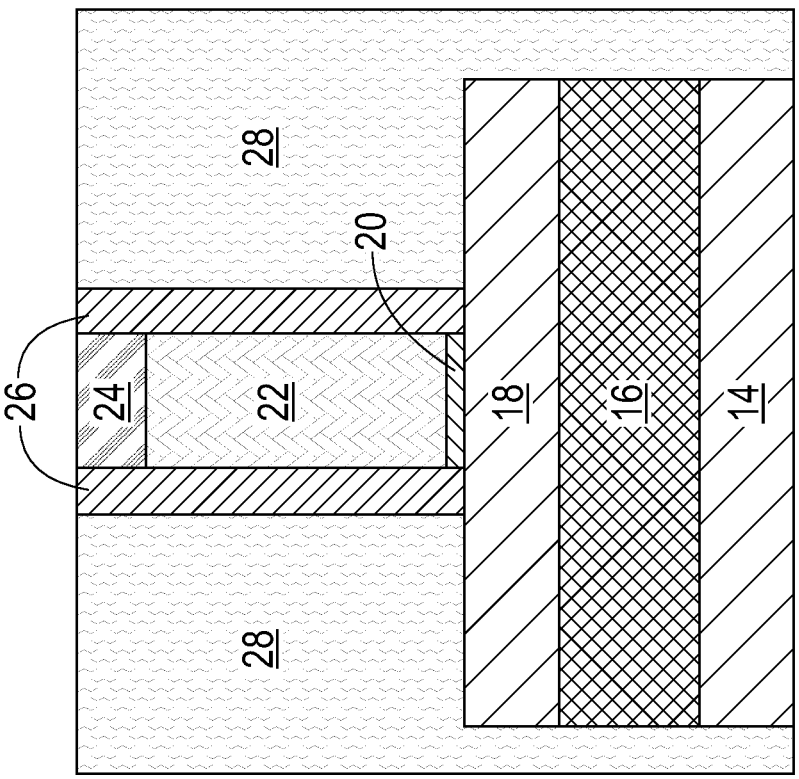
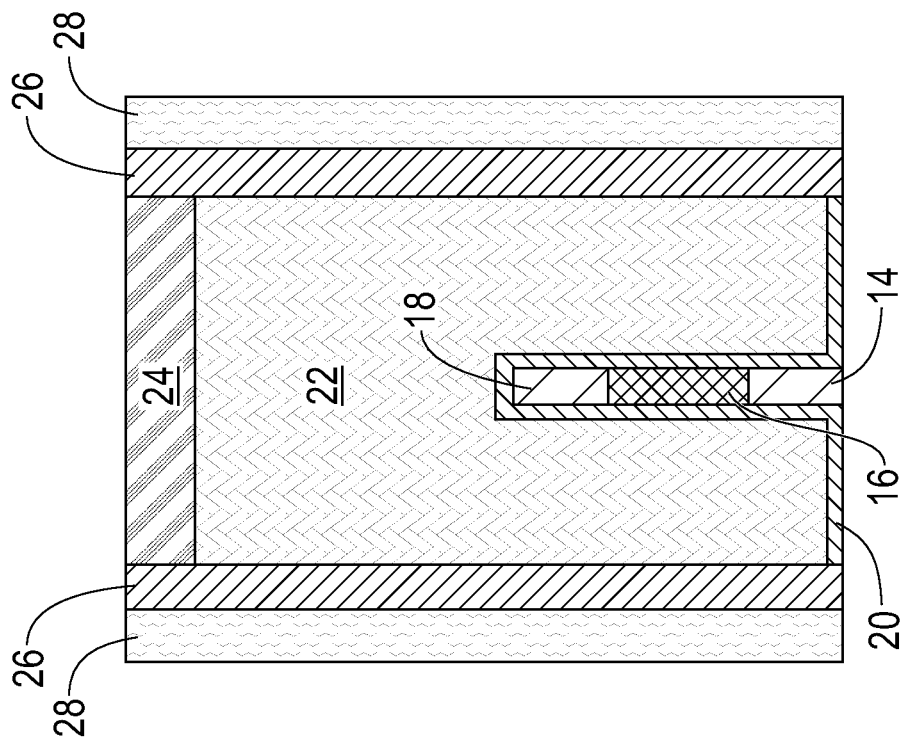
FIG. 3A
FIG. 3B

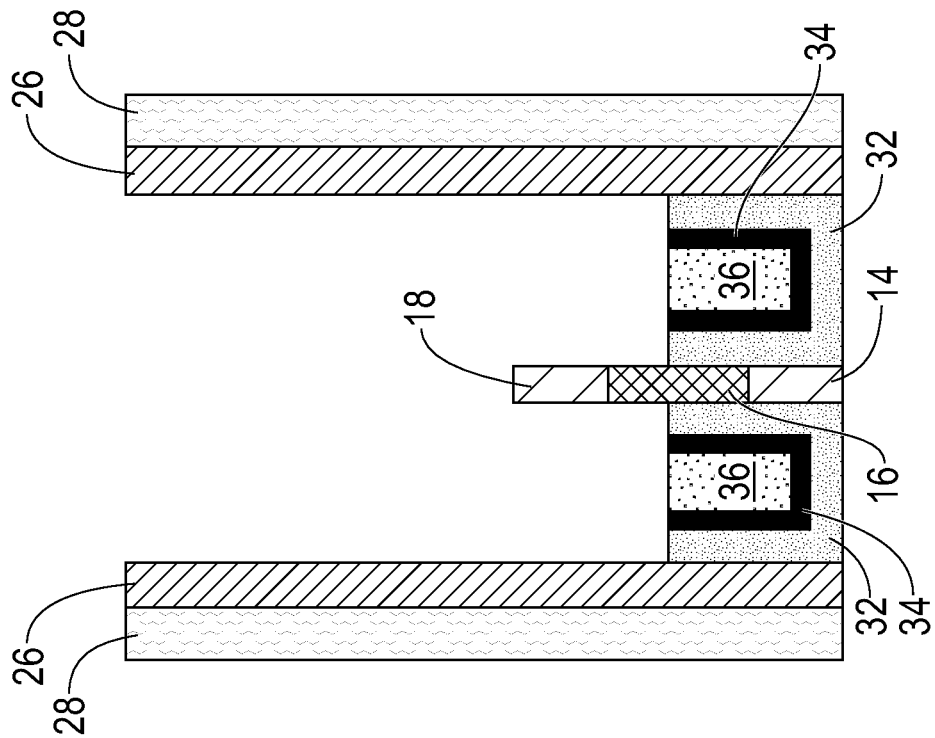
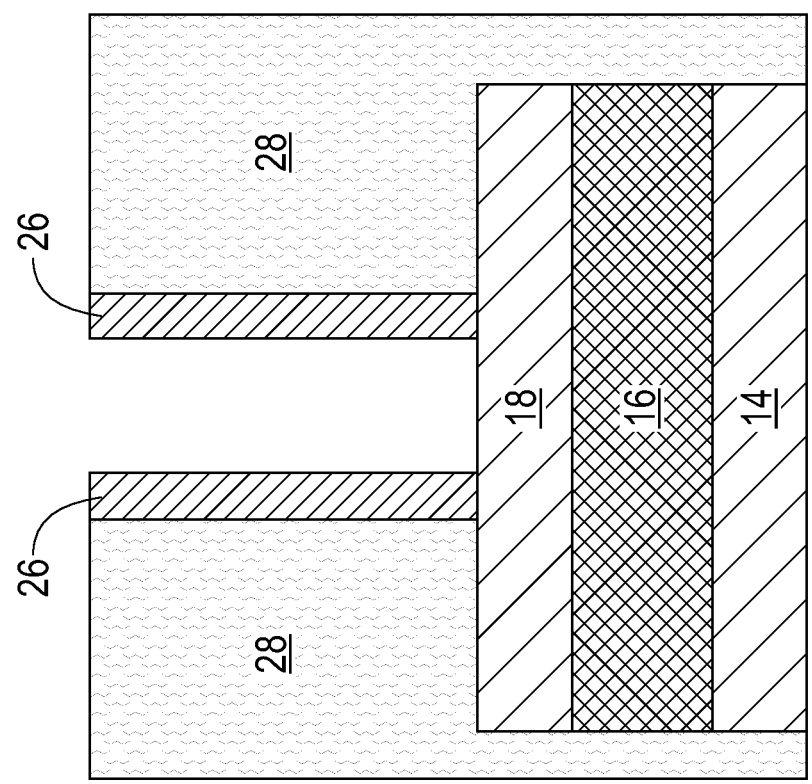
FIG. 6A
FIG. 6B

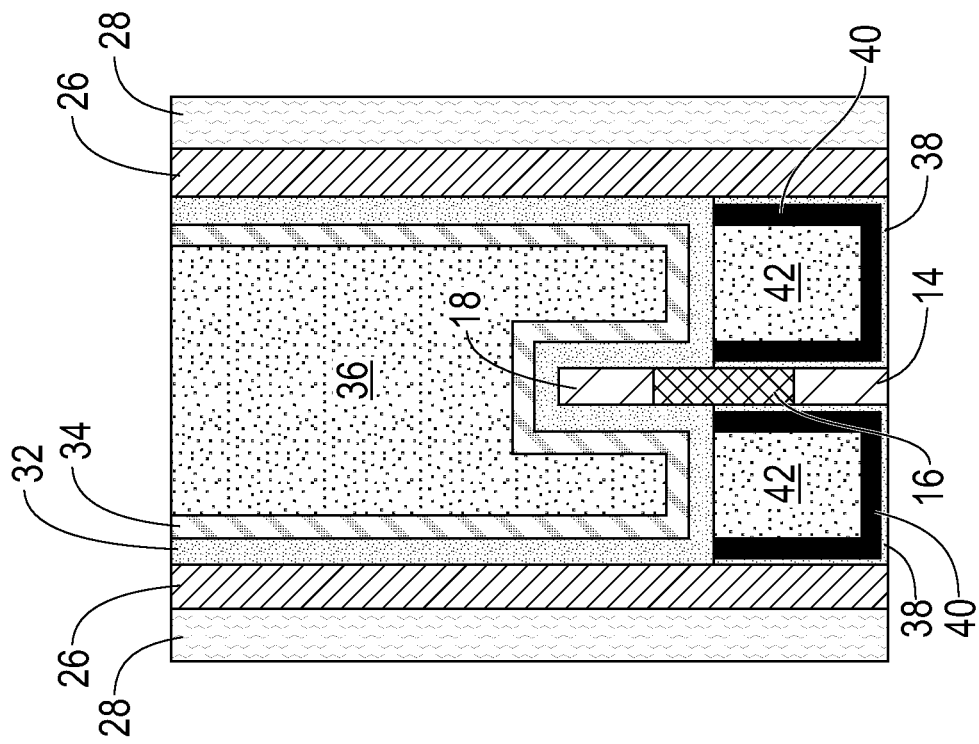
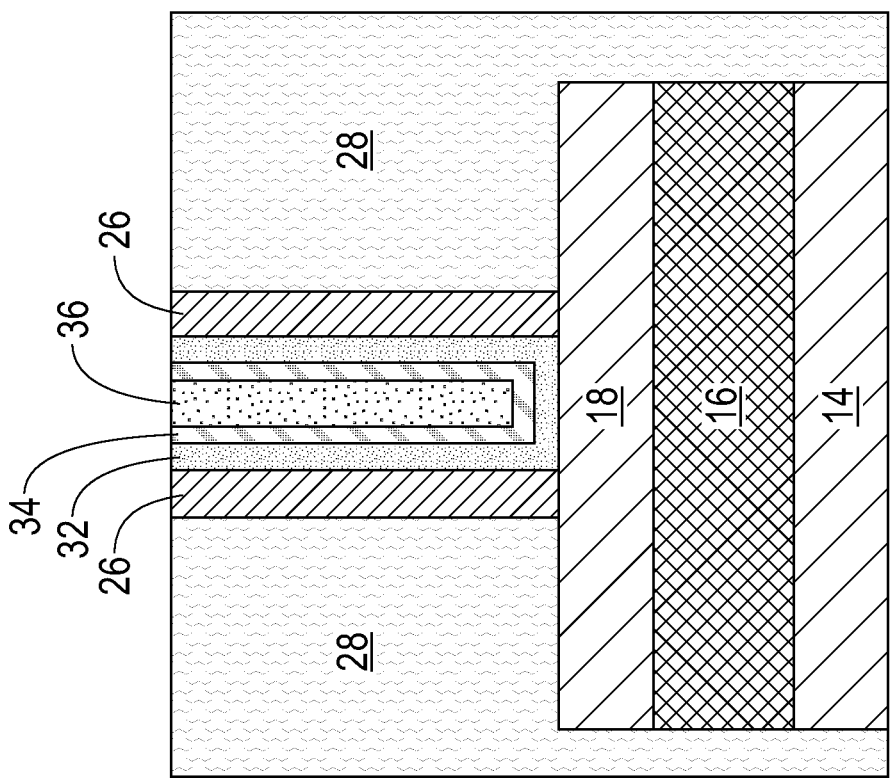
FIG. 8A
FIG. 8B

US 10,636,804 B1

STACKED FINFET PROGRAMMABLE INVERTER (EPROM)

BACKGROUND

The present application relates to a semiconductor structure and a method of forming the same. More particularly, the present application relates to a programmable complementary metal oxide semiconductor (CMOS) inverter structure that is integrated in a stacked FinFET.

Monolithic three-dimensional (3D) integration is considered as an alternative approach to continue transistor density scaling. One scenario is to stack an n-type field effect transistor (nFET) and a p-type field effect transistor (pFET) on top of each other creating a stacked FinFET structure. However, programmable CMOS inverters are needed in custom chip structures. There is thus a need to provide a programmable CMOS inverter (i.e., erasable programmable read only memory (EPROM)) which is compatible with a stacked FinFET processing flow.

SUMMARY

A stacked FinFET programmable inverter is provided that includes a pFET gate structure including a floating gate and a thicker gate dielectric material layer than a gate dielectric material layer of an nFET gate structure stacked either above, or below, the nFET gate structure. In one embodiment, the pFET gate structure is below the nFET gate structure. In such an embodiment, the pFET gate structure contacts a sidewall of a first semiconductor fin portion of a fin structure, and the nFET gate structure contacts a sidewall of a second semiconductor fin portion of the fin structure. An insulator fin portion is present in the fin structure that separates the first and second semiconductor fin portions from each other. In another embodiment, the pFET gate structure is above the nFET gate structure. In such an embodiment, the pFET gate structure contacts a sidewall of a second semiconductor fin portion of a fin stack, and the nFET gate structure contacts a sidewall of a first semiconductor fin portion of the fin structure.

In one aspect of the present application, a stacked FinFET programmable inverter is provided. In one embodiment, the stacked FinFET programmable inverter includes a fin structure extending upward from an insulator layer. The fin structure includes, from bottom to top, a first semiconductor fin portion, an insulator fin portion, and a second semiconductor fin portion. A pFET gate structure including a floating gate electrode and a first gate dielectric material layer having a first thickness contacts a sidewall of the first semiconductor fin portion, and an nFET gate structure including a second gate dielectric material layer having a second thickness that is less than the first thickness contacts a sidewall of the second semiconductor fin portion.

In another embodiment, the stacked FinFET programmable inverter includes a fin structure extending upward from an insulator layer. The fin structure includes, from bottom to top, a first semiconductor fin portion, an insulator fin portion, and a second semiconductor fin portion. A pFET gate structure including a floating gate electrode and a first gate dielectric material layer having a first thickness contacts a sidewall of the second semiconductor fin portion, and an nFET gate structure including a second gate dielectric material layer having a second thickness that is less than the first thickness contacts a sidewall of the first semiconductor fin portion.

In another aspect of the present application, a method of forming a stacked FinFET programmable inverter is provided. In one embodiment, the method includes forming a fin structure extending upward from an insulator layer. The fin structure includes, from bottom to top, a first semiconductor fin portion, an insulator fin portion, and a second semiconductor fin portion. A pFET gate structure including a floating gate electrode and a first gate dielectric material layer having a first thickness is formed contacting a sidewall of one of the first semiconductor fin portion or the second semiconductor fin portion. An nFET gate structure including a second gate dielectric material layer having a second thickness that is less than the first thickness is formed contacting a sidewall of the other of the first and second semiconductor fin portions not containing the pFET gate structure.

For example, and in one embodiment, the pFET gate structure is formed contacting the sidewall of the first semiconductor fin portion, while the nFET gate structure is formed containing the sidewall of the second semiconductor fin portion. In another embodiment, the nFET gate structure is formed contacting the sidewall of the first semiconductor fin portion, and the pFET gate structure is formed contacting the sidewall of the second semiconductor fin portion.

BRIEF DESCRIPTION OF THE DRAWINGS

FIG. 1A is a top down view of an exemplary semiconductor structure that can be employed in the present application and including a fin structure extending upward from an insulator layer, wherein the fin structure includes, from bottom to top, a first semiconductor fin portion, an insulator fin portion, and a second semiconductor fin portion.

FIG. 1B is a cross sectional view of the exemplary semiconductor structure of FIG. 1A through line Y-Y'.

FIG. 1C is a cross sectional view of the exemplary semiconductor structure of FIG. 1A through line X-X'.

FIG. 3A is a cross sectional view of the exemplary semiconductor structure of FIG. 2A after forming an interlayer dielectric (ILD) material laterally surrounding the sacrificial gate structure and the dielectric spacer.

FIG. 3B is a cross sectional view of the exemplary semiconductor structure of FIG. 2B after forming an interlayer dielectric (ILD) material laterally surrounding the sacrificial gate structure and the dielectric spacer.

FIG. 6A is cross sectional view of the exemplary semiconductor structure of FIG. 5A after removing the pFET gate structure from the surfaces of the second semiconductor fin portion, while maintaining the pFET gate structure on a sidewall surface of the first semiconductor fin portion.

FIG. 6B is cross sectional view of the exemplary semiconductor structure of FIG. 5B after removing the pFET gate structure from the surfaces of the second semiconductor fin portion, while maintaining the pFET gate structure on a sidewall surface of the first semiconductor fin portion.

FIGS. 8A (through Y-Y') and 8B (through X-X') illustrate an alternative structure of the present application in which the nFET gate structure is formed at the bottom of the gate cavity and contacting a sidewall of the first semiconductor fin portion, and the pFET gate structure is formed at the top of the gate cavity and contacting a sidewall surface of the second semiconductor fin portion.

DETAILED DESCRIPTION

Figure 2B:
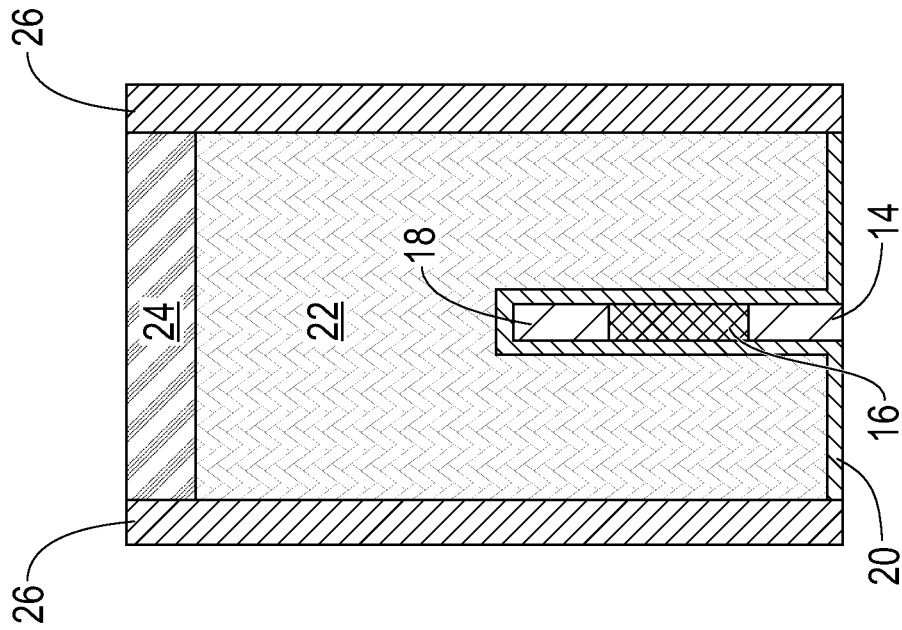
FIG. 2B is a cross sectional view of the exemplary semiconductor structure of FIG. 1C after forming a sacrificial gate structure on a surface of the fin structure and forming a dielectric spacer on a sidewall of the sacrificial gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIGS. 1A, 1B and 1C, there are illustrated an exemplary semiconductor structure that can be employed in accordance with an embodiment of the present application. The exemplary semiconductor structure of FIGS. 1A, 1B and 1C includes a fin structure, FS, extending upward from an insulator layer 12L, wherein the fin structure, FS, includes, from bottom to top, a first semiconductor fin portion 14, an insulator fin portion 16, and a second semiconductor fin portion 18. As is shown, the insulator layer 12L is located on a surface of a semiconductor substrate 10L. It should be noted that although the present application describes and illustrates a single fin structure, FS, the present application is not limited to forming only a single fin structure, FS. Instead, the present application contemplates embodiments in which a plurality of fin structures are formed on the insulator layer 12L. When a plurality of fin structures are formed, the fin structures are oriented parallel to each other. Each fin structure has a same vertical height, width and length.

The term "fin structure" is used in the present application to define a structure that is composed of first and second semiconductor materials that are vertically separated from each other by an insulator material, and including a pair of vertical sidewalls that are parallel to each other. A surface is "vertical" if there exists a vertical plane from which the surface does not deviate by more than three times the root mean square roughness of the surface. In one embodiment, each fin structure, FS, has a vertical height from 20 nm to 200 nm, a width from 5 nm to 30 nm, and a length from 20 nm to 200 nm. Other vertical heights and/or widths and/or lengths that are lesser than, or greater than, the ranges mentioned herein can also be used in the present application.

Semiconductor substrate 10L includes at least one semiconductor material having semiconducting properties. Examples of semiconductor materials that provide the semiconductor substrate 10L include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

The semiconductor substrate 10L can be a single crystalline semiconductor material. The semiconductor substrate 10L can have any of the well known crystal orientations. For example, the crystal orientation of the semiconductor substrate 10L may be {100}, {110}, or {111}. Other crystallographic orientations besides those specifically mentioned can also be used in the present application.

The first insulator layer 12L, which is located on a physically exposed surface of the semiconductor substrate 10L, may include a crystalline or non-crystalline dielectric material. In one example, the first insulator layer 12L may be composed of silicon dioxide and/or boron nitride. The first insulator layer 12L may have a thickness from 20 nm to 100 nm. Other thicknesses that are less than 20 nm and greater than 100 nm can also be used as the thickness of the first insulator layer 12L.

The first semiconductor fin portion 14 is composed of one of the semiconductor materials mentioned above for the semiconductor substrate 10L. In one embodiment, the first semiconductor fin portion 14 is composed of a same semiconductor material as the semiconductor substrate 10L. In another embodiment, the first semiconductor fin portion 14 may be composed of a different semiconductor material than the semiconductor substrate 10L. The first semiconductor fin portion 14 may have a thickness from 50 nm to 250 nm. Other thicknesses that are less than 50 nm and greater than 250 nm can also be used as the thickness of the first semiconductor fin portion 14.

The insulator fin portion 16 may include a crystalline or non-crystalline dielectric material. The dielectric material that provides the insulator fin portion 16 may be the same as, or different from, the dielectric material that provides the first insulator layer 12L. In one example, the insulator fin portion 16 may be composed of silicon dioxide and/or boron nitride. The insulator fin portion 16 may have a thickness within the thickness range mentioned above for the first insulator layer 12L.

The second semiconductor fin portion 18 is composed of one of the semiconductor materials mentioned above for the semiconductor substrate 10L. In one embodiment, the second semiconductor fin portion 18 is composed of a same semiconductor material as the semiconductor substrate 10L. In another embodiment, the second semiconductor fin portion 18 may be composed of a different semiconductor material than the semiconductor substrate 10L. The semiconductor material that provides the second semiconductor fin portion 18 may be the same as, or different from, the semiconductor material that provides the first semiconductor fin portion 14. The second semiconductor fin portion 18 may have a thickness within the thickness range mentioned above for the first semiconductor fin portion 14.

The exemplary semiconductor structure of FIG. 1 can be formed utilizing any conventional process. In one embodiment, the exemplary semiconductor structure of FIG. 1 can be formed by first providing, and in any order, a semiconductor-on-insulator (SOI) substrate that includes the semiconductor substrate 10L, the first insulator layer 12L, and a first semiconductor material (which provides the first semiconductor fin portion 14), and a semiconductor wafer that includes a handle substrate (not shown), a second semiconductor material layer (that provides the second semiconductor fin portion) and a second insulator layer (which provides the insulator fin portion 16). A wafer bonding process is then used to bond the first semiconductor material layer of the SOI substrate to the second insulator layer of the semiconductor wafer.

After wafer bonding, the handle substrate is removed and thereafter the fin structure(s) is formed by patterning the second semiconductor material layer, the second insulator layer and the first semiconductor material layer; the patterning stops on a topmost surface of the first insulator layer 12L. Patterning may be performed by lithography and etching, a sidewall image transfer (SIT) process or by a direct self-assembly (DSA) process in which a copolymer that is capable of direct self-assembly is used. Such patterning processes are well known to those skilled in the art therefore the details of each of the aforementioned patterning processes has be omitted so as not to obscure the method of the present application.

Figure 2A:
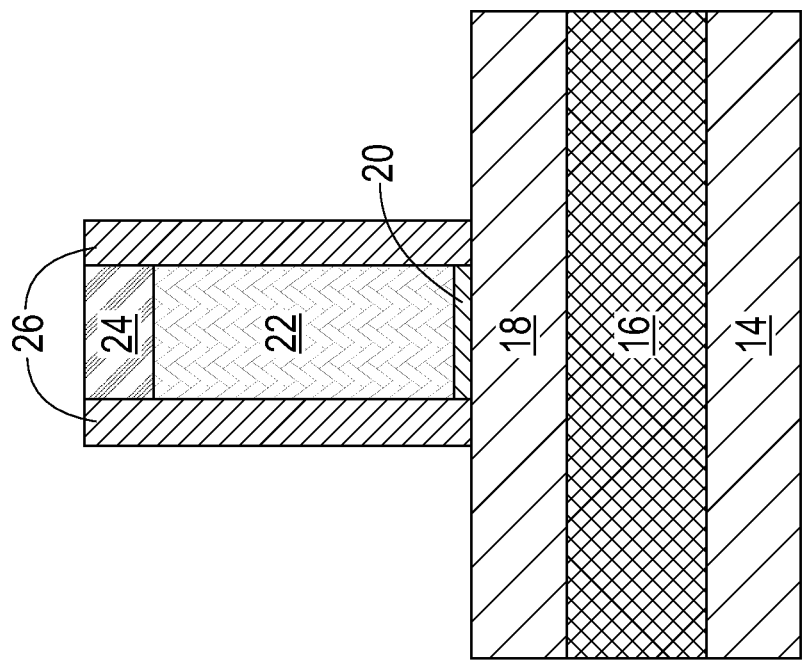
FIG. 2A is a cross sectional view of the exemplary semiconductor structure of FIG. 1B after forming a sacrificial gate structure on a surface of the fin structure and forming a dielectric spacer on a sidewall of the sacrificial gate structure.

Referring now to FIGS. 2A-2B, there are shown the exemplary semiconductor structure of FIGS. 1A, 1B and 1C after forming a sacrificial gate structure on a surface of the fin structure, FS, and forming a dielectric spacer 26 on a sidewall of the sacrificial gate structure. In FIGS. 2A-2B, and the remaining drawings, the insulator layer 12L and the semiconductor substrate 10L are not shown for clarity.

The sacrificial gate structure may include a single sacrificial material or a stack of two or more sacrificial materials (i.e., the sacrificial gate structure includes at least one sacrificial material). In one embodiment and as is illustrated in FIGS. 2A-2B, the at least one sacrificial material comprises, from bottom to top, a sacrificial gate dielectric material 20, a sacrificial gate material 22 and a sacrificial dielectric cap 24. In some embodiments, the sacrificial gate dielectric material 20 and/or the sacrificial dielectric cap 24 can be omitted and only a sacrificial gate material 22 is formed. The at least one sacrificial material can be formed by forming a blanket layer (or layers) of a material (or various materials) and then patterning the material (or various materials) by lithography and etching. In one embodiment, the at least one sacrificial material can be formed by first depositing a blanket layer of a sacrificial gate dielectric material 20. The sacrificial gate dielectric material 20 can be an oxide, nitride, and/or oxynitride. In one example, the sacrificial gate dielectric material 20 can be a high k material having a dielectric constant greater than 4.0. In some embodiments, a multilayered dielectric structure comprising different dielectric materials, e.g., silicon dioxide, and a high k dielectric can be formed and used as the sacrificial gate dielectric material 20. The sacrificial gate dielectric material 20 can be formed by any deposition technique including, for example, chemical vapor deposition (CVD), plasma enhanced chemical vapor deposition (PECVD), physical vapor deposition (PVD), sputtering, or atomic layer deposition.

A blanket layer of a sacrificial gate material 22 can be formed on the blanket layer of sacrificial gate dielectric material 20. The sacrificial gate material 22 can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material 22 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

A blanket layer of a sacrificial gate cap material 24 can be formed on the blanket layer of sacrificial gate material 22. The sacrificial gate cap material 24 may include a hard mask material such as, for example, silicon dioxide and/or silicon nitride. The sacrificial gate cap material 24 can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure (20/22/24).

Dielectric spacer 26 is composed of a dielectric spacer material such as, for example, silicon nitride. Dielectric spacer 26 may be formed by deposition of a dielectric spacer material, followed by a spacer etch. The deposition of the dielectric spacer material includes, for example, chemical vapor deposition (CVD), plasma enhanced chemical vapor deposition (PECVD), or physical vapor deposition (PVD). The spacer etch may include a reactive ion etch. Dielectric spacer 26 typically contacts an entirety of the sidewalls of the sacrificial gate structure.

Referring now to FIGS. 3A-3B, there are illustrated the exemplary semiconductor structure of FIGS. 2A-2B after forming an interlayer dielectric (ILD) material 28 laterally surrounding the sacrificial gate structure (20/22/24) and the dielectric spacer 26. The ILD material 28 contacts the dielectric spacer 26 and has a topmost surface that is coplanar with a topmost surface of the dielectric spacer 26 and the topmost surface of the sacrificial gate structure.

The ILD material 28 is composed of a dielectric material that is compositionally different from the dielectric material of the dielectric spacer 26. Examples of dielectric materials that can be used for ILD material 28 include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In one embodiment, the ILD material 28 can be formed by a deposition process such as, for example, chemical vapor deposition (CVD), plasma enhanced chemical vapor deposition (PECVD), evaporation or spin-on coating. Following the deposition of the ILD material, a planarization process such as, for example, chemical mechanical polishing (CMP) and/or grinding, is employed.

Figures 4A, 4B:
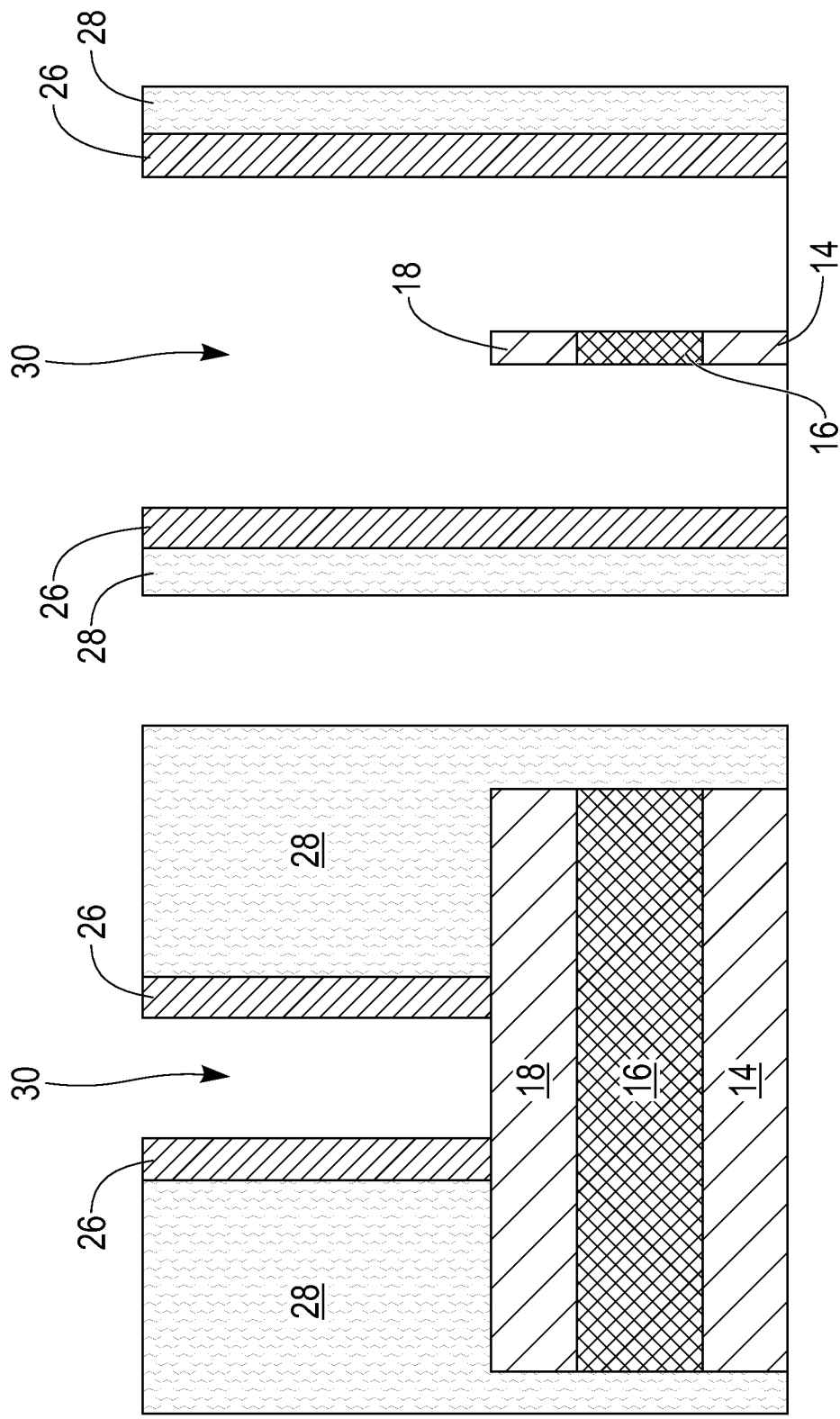
FIG. 4A is a cross sectional view of the exemplary semiconductor structure of FIG. 3A after removing the sacrificial gate structure providing a gate cavity.
FIG. 4B is a cross sectional view of the exemplary semiconductor structure of FIG. 3B after removing the sacrificial gate structure providing a gate cavity.

Referring now to FIGS. 4A-4B, there are illustrated the exemplary semiconductor structure of FIGS. 3A-3B after removing the sacrificial gate structure (20/22/24) providing a gate cavity 30. The sacrificial gate structure (20/22/24) can be removed utilizing one or more anisotropic etching processes such as, for example, reactive ion etching. The removal of the sacrificial gate structure (20/22/24) physically exposes a portion of the fin structure, FS.

Figure 5B:
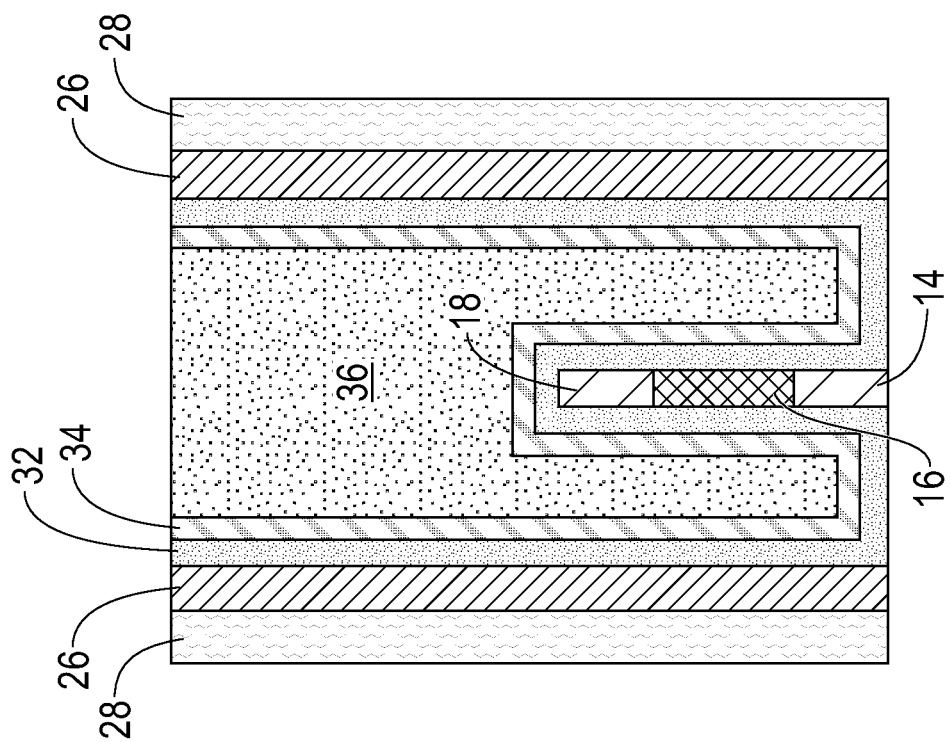
FIG. 5B is cross sectional view of the exemplary semiconductor structure of FIG. 4B after forming a pFET gate structure in the gate cavity, wherein the pFET gate structure includes a first gate dielectric material layer having a first thickness.
Figure 5A:
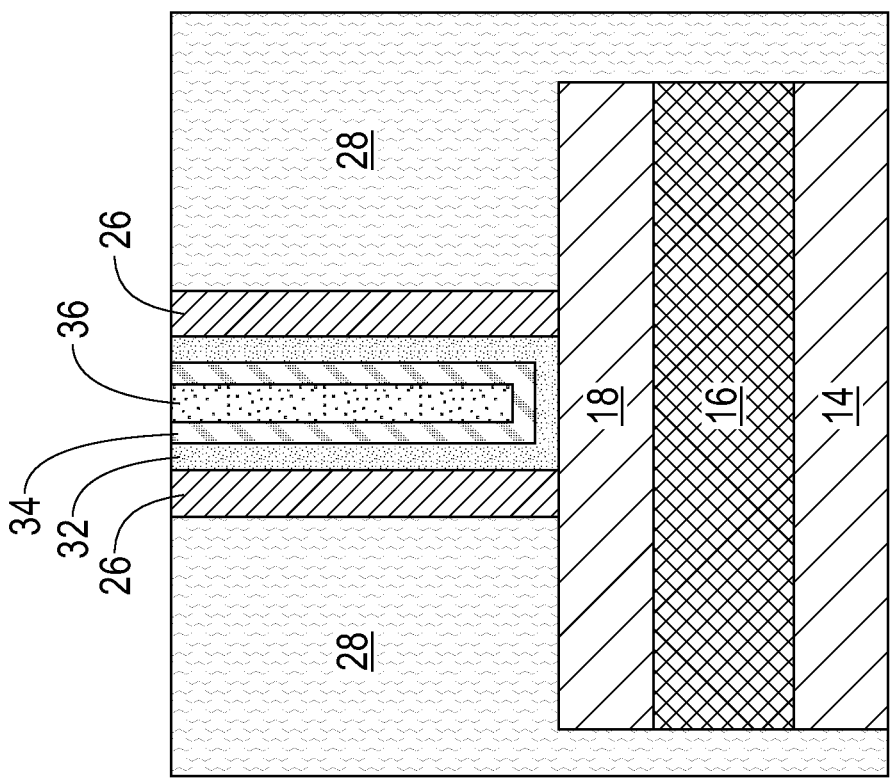
FIG. 5A is cross sectional view of the exemplary semiconductor structure of FIG. 4A after forming a pFET gate structure in the gate cavity, wherein the pFET gate structure includes a first gate dielectric material layer having a first thickness.

Referring now to FIGS. 5A-5B, there are illustrated the exemplary semiconductor structure of FIGS. 4A-4B after forming a pFET gate structure in the gate cavity, wherein the pFET gate structure includes a first gate dielectric material layer 32 having a first thickness. The pFET gate structure also includes a first work function setting layer 34 and a first gate conductor 36.

The first gate dielectric material layer 32 is composed of a gate dielectric material such as, for example, an oxide, nitride, and/or oxynitride. In one example, the first gate dielectric material layer 32 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the first gate dielectric material layer 32.

The first thickness of the first gate dielectric material layer 32 allows for the first gate electrode 38 to be floating (i.e., not electrically connected). In one embodiment, the first thickness of the first gate dielectric material layer 32 is from 2 nm to 20 nm. Other thicknesses are possible as long as the selected thickness is capable of storing charge/information.

The pFET gate structure is not connected so the charge stays on the thick gate dielectric, i.e., the first gate dielectric material layer 32.

The first work function setting layer 34 includes any suitable p-type work function metal (WFM) containing material. In one embodiment, the p-type WFM containing material that can be employed as the first work function setting layer 34 is composed of titanium nitride (TiN), titanium carbide (TiC), TiAlN, Ru, Pt, Mo, Co or alloys and combinations thereof.

The first gate electrode 36 may be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, carbon nanotube, conductive carbon, graphene, or any suitable combination of these materials. The conductive material may further comprise dopants that are incorporated during or after deposition.

The pFET gate structure (32, 34, 36) can be formed by sequentially depositing the first gate dielectric material layer 32, the first work function setting layer 34, and the first gate electrode 36 into the gate cavity 30. A planarization process such as, for example, chemical mechanical polishing (CMP) and/or grinding may follow the sequential deposition processes to remove any material from the topmost surface of the ILD material 28 and the dielectric spacer 26.

At this point of the present application, the pFET gate structure (32, 34, 36) is located on the entirety of the physically exposed portion of the fin structure, FS, including along the sidewalls of the first semiconductor fin portion 14, the sidewall of the insulator fin portion 16, and the sidewalls and topmost surface of the second semiconductor fin portion 18.

Referring now to FIGS. 6A-6B, there are illustrated the exemplary semiconductor structure of FIGS. 5A-5B after removing the pFET gate structure (32, 34, 36) from the surfaces of the second semiconductor fin portion 18, while maintaining the pFET gate structure (32, 34, 36) on a sidewall surface of the first semiconductor fin portion 14; an upper portion of the pFET gate structure may also be in contact with a lower portion of the insulator fin portion 16.

The removal of the pFET gate structure (32, 34, 36) from the second semiconductor fin portion 18 the fin structure, FS, may be performed utilizing one or more recess etching processes which are selective in removing the pFET gate structure (32, 34, 36) from the second semiconductor fin portion 18.

Figure 7B:
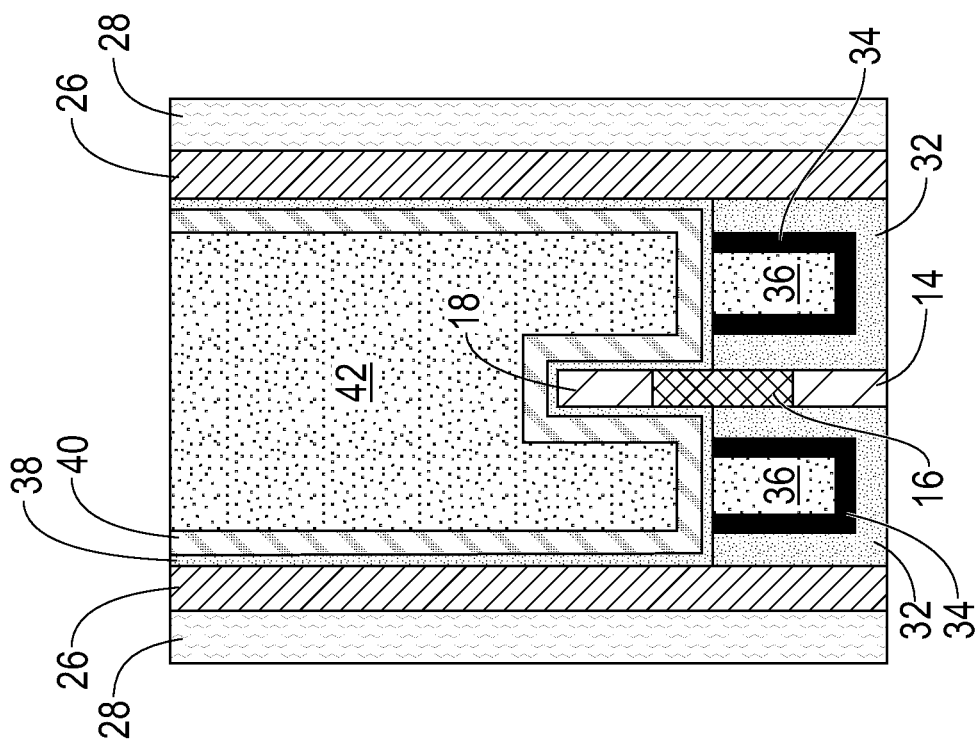
FIG. 7B is cross sectional view of the exemplary semiconductor structure of FIG. 7B after forming an nFET gate structure in the gate cavity and contacting physically exposed surfaces of the second semiconductor fin portion, wherein the nFET gate structure includes a second gate dielectric material layer having a second thickness that is less than the first thickness of the first gate dielectric material layer.
Figure 7A:
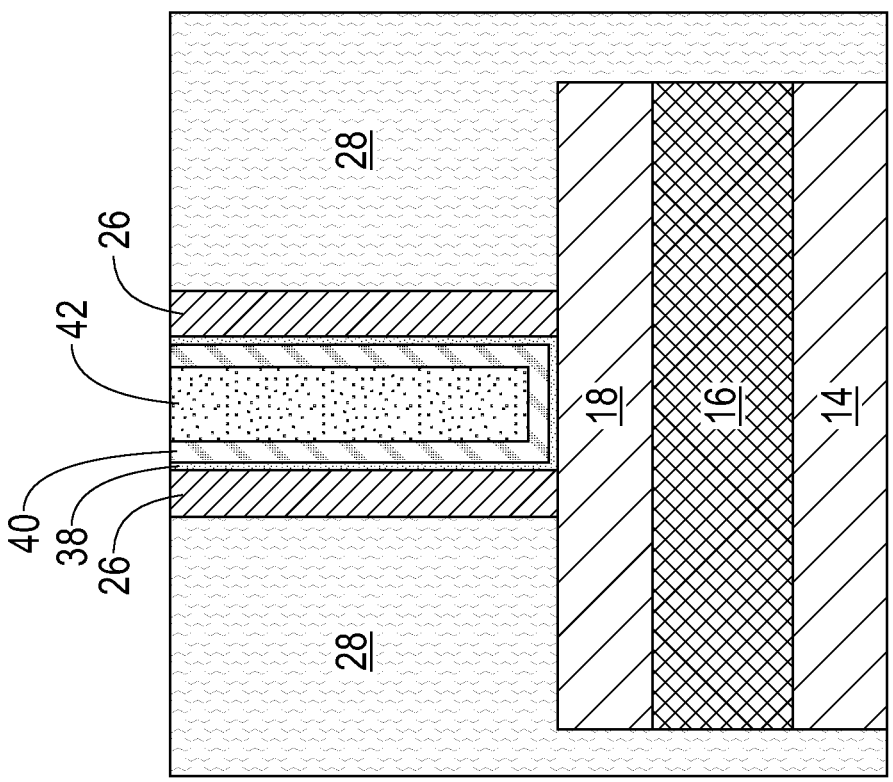
FIG. 7A is cross sectional view of the exemplary semiconductor structure of FIG. 6A after forming an nFET gate structure in the gate cavity and contacting physically exposed surfaces of the second semiconductor fin portion, wherein the nFET gate structure includes a second gate dielectric material layer having a second thickness that is less than the first thickness of the first gate dielectric material layer.

Referring now to FIGS. 7A-7B, there are illustrated the exemplary semiconductor structure of FIGS. 6A-6B after forming an nFET gate structure in the gate cavity 30 and contacting physically exposed surfaces of the second semiconductor fin portion 18, wherein the nFET gate structure comprises a second gate dielectric material layer 38 having a second thickness that is less than the first thickness of the first gate dielectric material layer 32. In this embodiment, the nFET gate structure is stacked atop the pFET gate structure. The nFET gate structure further includes a second work function setting layer 40, and a second gate electrode 42.

The second gate dielectric material layer 38 may include one of the gate dielectric materials mentioned above for the first gate dielectric material layer 32. In one embodiment, the second gate dielectric material layer 38 is composed of a same gate dielectric material as the first gate dielectric material layer 32. In another embodiment, the second gate dielectric material layer 38 is composed of a compositionally different gate dielectric material than the first gate dielectric material layer 22. The second thickness of the second gate dielectric material layer 38 can be from 0.5 nm to 3 nm.

The second work function setting layer 40 includes any n-type work function metal containing material. In one embodiment, the n-type work function metal containing material can be composed of at least one of TiAl, TaN, TiN, HfN, HfSi, or combinations thereof.

The second gate electrode 42 may include one of the conductive materials mentioned above for the first gate electrode layer 36. In one embodiment, the second gate electrode layer 42 is composed of a same conductive material as the first electrode 36. In another embodiment, the second gate electrode 42 is composed of a compositionally different conductive material than the first gate electrode 36. The nFET gate structure (38, 40, 42) can be formed utilizing the technique mentioned above in forming the pFET gate structure (32, 34, 36).

Notably, FIGS. 7A-7B illustrate a stacked FinFET programmable inverter in accordance with the present application in which the pFET gate stack is programmable. In this embodiment, the first gate electrode 32 of the pFET gate structure (32, 34, 36) is a floating gate (i.e., it is not electrically connected), while the second gate electrode 42 of the nFET gate structure (38, 40, 42) is electrically connected. The thick gate dielectric material layer 32 of the pFET gate structure provides a charge storage region of the programmable inverter of the present application. Moreover, the nFET gate structure is disconnected/decoupled (capacitance-wise) from the pFET gate structure due to the thick first gate dielectric material layer 32.

The stacked FinFET programmable inverter of FIGS. 7A-7B includes a fin structure, FS, extending upward from an insulator layer 12L, wherein the fin structure, FS, comprises, from bottom to top, a first semiconductor fin portion 14, an insulator fin portion 16, and a second semiconductor fin portion 18. A pFET gate structure (32, 34, 36) including a floating gate and a first gate dielectric material layer 32 having a first thickness contacts a sidewall of the first semiconductor fin portion 14. An nFET gate structure (38, 40, 42) including a second gate dielectric material layer 38 having a second thickness that is less than the first thickness contacts a sidewall of the second semiconductor fin portion 18. A portion of the nFET gate structure (38, 40, 42) may contact an upper portion of the insulator fin portion 16. In the embodiment shown in FIGS. 7A-7B, the nFET gate structure is present on a topmost surface of the second semiconductor fin portion 18. In the present application, the nFET gate structure is in direct physically contact with the pFET gate structure.

At this point of the present application, a bottom source/drain structure (not shown) can be epitaxially grown from a physically exposed surface of the first semiconductor fin portion, and a top source/drain structure (not shown) can be epitaxially grown from a physically exposed surface of the second semiconductor fin portion. The top and bottom source/drain structures are not merged with each other. The top and bottom source/drain structures are composed of a semiconductor material and an n-type dopant or a p-type dopant as are well known to those skilled in the art.

After forming the source/drain regions, contact formation and metallization is performed utilizing techniques that are well known those skilled in the art. See, for example, U.S. Pat. No. 9,659,963, the entire content of which is incorporated herein by reference.

Referring now to FIGS. 8A-8B, there are illustrated an alternative structure of the present application in which the nFET gate structure (i.e., the nFET including elements 38, 40, 42) is formed at the bottom of the gate cavity and contacting a sidewall of the first semiconductor fin portion 14, and the pFET gate structure (i.e., the pFET including elements 32, 34, 36) is formed at the top of the gate cavity and contacting a sidewall surface of the second semiconductor fin portion 18. The alternative structure of the present application is the reverse shown in FIGS. 7A-7B. The pFET gate structure shown in FIGS. 8A-8B is programmable.

The first gate electrode 36 of the pFET gate structure is a floating gate, while the second gate electrode 42 of the nFET gate structure is electrically connected. The thick gate dielectric material layer 32 of the pFET gate structure provides a charge storage region of the programmable inverter. Moreover, the nFET gate structure is disconnected/decoupled (capacitance-wise) from the pFET gate structure due to the thick first gate dielectric material layer 32.

The stacked FinFET programmable inverter of FIGS. 8B-8B includes a fin structure, FS, extending upward from an insulator layer 12L, wherein the fin structure, FS, comprises, from bottom to top, a first semiconductor fin portion 14, an insulator fin portion 16, and a second semiconductor fin portion 18. A pFET gate structure (32, 34, 36) including a first gate dielectric material layer 32 having a first thickness contacts a sidewall of the second semiconductor fin portion 18. An nFET gate structure (38, 40, 42) including a second gate dielectric material layer 38 having a second thickness that is less than the first thickness contacts a sidewall of the first semiconductor fin portion 14. A portion of the nFET gate structure (38, 40, 42) may contact a lower portion of the insulator fin portion. 16, while a portion of the pFET gate structure (32, 34, 36) may contact an upper portion of the insulator fin portion 16. In the embodiment shown in FIGS. 8A-8B, the pFET gate structure is present on a topmost surface of the second semiconductor fin portion 18. In the present application, the nFET gate structure is in direct physically contact with the pFET gate structure.

At this point of the present application, a bottom source/drain structure (not shown) can be epitaxially grown from a physically exposed surface of the first semiconductor fin portion, and a top source/drain structure (not shown) can be epitaxially grown from a physically exposed surface of the second semiconductor fin portion. The top and bottom source/drain structures are not merged with each other. The top and bottom source/drain structures are composed of a semiconductor material and an n-type dopant or a p-type dopant as are well known to those skilled in the art.

After forming the source/drain regions, contact formation and metallization is performed utilizing techniques that are well known those skilled in the art. See, for example, U.S. Pat. No. 9,659,963, the entire content of which is incorporated herein by reference.

Figure 9:
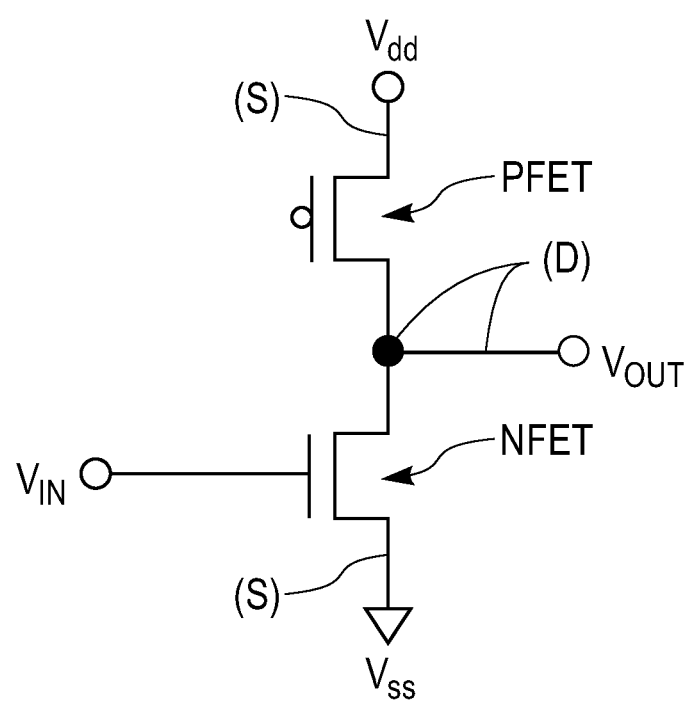
FIG. 9 is a circuit diagram for the stacked FinFET programmable inverter of the present application.

Referring now to FIG. 9, there is illustrated a circuit diagram for the stacked FinFET programmable inverter of the present application. In the drawing, S denotes a source region, D denotes a drain region, Vin denotes voltage entering the circuit, Vout denotes voltage exiting the circuit, Vdd denotes positive voltage and Vss denotes ground. The nFET and pFET are stacked one atop the other as described in either the embodiment shown in FIGS. 7A-7B or the embodiment shown in FIGS. 8A-8B.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A stacked FinFET programmable inverter comprising:
    a fin structure extending upward from an insulator layer, wherein the fin structure comprises, from bottom to top, a first semiconductor fin portion, an insulator fin portion, and a second semiconductor fin portion;
    a pFET gate structure comprising a floating gate and a first gate dielectric material layer having a first thickness and a contacting a sidewall of the first semiconductor fin portion; and
    an nFET gate structure comprising a second gate dielectric material layer having a second thickness that is less than the first thickness and contacting a sidewall of the second semiconductor fin portion.

2. The stacked FinFET programmable inverter of claim 1, wherein the pFET gate structure contacts a lower portion of the insulator fin portion, and the nFET gate structure contacts an upper portion of the insulator fin portion.

3. The stacked FinFET programmable inverter of claim 1, wherein the first gate dielectric material layer provides a charge storage region of the stacked FinFET programmable inverter.

4. The stacked FinFET programmable inverter of claim 1, wherein the nFET gate structure is in direct physically contact with the pFET gate structure.

5. The stacked FinFET programmable inverter of claim 1, wherein the pFET gate structure further comprises a first work function setting layer composed of a p-type work function metal (WFM) containing material, and the nFET gate structure further comprises a second work function setting layer composed of an n-type work function metal (WFM) containing material.

6. The stacked FinFET programmable inverter of claim 1, wherein the nFET gate structure further contacts a topmost surface of the second semiconductor fin portion.

7. The stacked FinFET programmable inverter of claim 1, wherein the insulator layer is present on a semiconductor substrate.

8. A stacked FinFET programmable inverter comprising:
    a fin structure extending upward from an insulator layer, wherein the fin structure comprises, from bottom to top, a first semiconductor fin portion, an insulator fin portion, and a second semiconductor fin portion;
    a pFET gate structure comprising a floating gate and a first gate dielectric material layer having a first thickness and a contacting a sidewall of the second semiconductor fin portion; and
    an nFET gate structure comprising a second gate dielectric material layer having a second thickness that is greater than the first thickness and contacting a sidewall of the first semiconductor fin portion.

9. The stacked FinFET programmable inverter of claim 8, wherein the pFET gate structure contacts an upper portion of the insulator fin portion, and the nFET gate structure contacts a lower portion of the insulator fin portion.

10. The stacked FinFET programmable inverter of claim 8, wherein the first gate dielectric material layer provides a charge storage region of the stacked FinFET programmable inverter.

11. The stacked FinFET programmable inverter of claim 8, wherein the pFET gate structure is in direct physically contact with the nFET gate structure.

12. The stacked FinFET programmable inverter of claim 8, wherein the pFET gate structure further comprises a first work function setting layer composed of a p-type work function metal (WFM) containing material, and the nFET gate structure further comprises a second work function setting layer composed of an n-type work function metal (WFM) containing material.

13. The stacked FinFET programmable inverter of claim 8, wherein the pFET gate structure further contacts a topmost surface of the second semiconductor fin portion.

14. The stacked FinFET programmable inverter of claim 8, wherein the insulator layer is present on a semiconductor substrate.

15. A method of forming a semiconductor structure, the method comprising:
    forming a fin structure extending upward from an insulator layer, the fin structure comprising, from bottom to top, a first semiconductor fin portion, an insulator fin portion, and a second semiconductor fin portion;
    forming a pFET gate structure comprising a floating gate electrode and a first gate dielectric material layer having a first thickness and contacting a sidewall of one of the first semiconductor fin portion or the second semiconductor fin portion; and
    forming an nFET gate structure including a second gate dielectric material layer having a second thickness that is less than the first thickness and contacting a sidewall of the other of the first and second semiconductor fin portions not containing the pFET gate structure.

16. The method of claim 15, wherein the pFET gate structure is formed contacting the sidewall of the first semiconductor fin portion, and the nFET gate structure is formed containing the sidewall of the second semiconductor fin portion.

17. The method of claim 16, wherein the pFET gate structure contacts a lower portion of the insulator fin portion, and the nFET gate structure contacts an upper portion of the insulator fin portion.

18. The method of claim 15, wherein the nFET gate structure is formed contacting the sidewall of the first semiconductor fin portion, and the pFET gate structure is formed contacting the sidewall of the second semiconductor fin portion.

19. The method of claim 18, wherein the pFET gate structure contacts a lower portion of the insulator fin portion, and the nFET gate structure contacts an upper portion of the insulator fin portion.

20. The method of claim 15, wherein the pFET gate structure and the nFET gate structure are in direct contact with each other.

* * * * *